(12) United States Patent
Hu et al.

(10) Patent No.: US 10,714,364 B2
(45) Date of Patent: Jul. 14, 2020

(54) APPARATUS AND METHOD FOR INSPECTING WAFER CARRIERS

(71) Applicant: Taiwan Semiconductor Manufacturing Co., Ltd., Hsin-Chu (TW)

(72) Inventors: Cheng-Kang Hu, Kaohsiung (TW); Shou-Wen Kuo, Hsinchu (TW); Sheng-Hsiang Chuang, Hsin-Chu (TW); Jiun-Rong Pai, Jhubei (TW); Hsu-Shui Liu, Pingjhen (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 258 days.

(21) Appl. No.: 15/965,701

(22) Filed: Apr. 27, 2018

(65) Prior Publication Data
US 2019/0067057 A1 Feb. 28, 2019

Related U.S. Application Data

(60) Provisional application No. 62/552,972, filed on Aug. 31, 2017.

(51) Int. Cl.
*G01M 3/38* (2006.01)
*H01L 21/67* (2006.01)
*H01L 21/677* (2006.01)

(52) U.S. Cl.
CPC ......... *H01L 21/67265* (2013.01); *G01M 3/38* (2013.01); *H01L 21/67259* (2013.01); *H01L 21/67288* (2013.01); *H01L 21/67772* (2013.01)

(58) Field of Classification Search
CPC ......... H01L 21/67259; H01L 21/67265; H01L 21/67288; H01L 21/67772; G01M 3/38
See application file for complete search history.

(56) References Cited

U.S. PATENT DOCUMENTS

| | | | |
|---|---|---|---|
| 6,473,169 B1 * | 10/2002 | Dawley | G01M 3/3263 250/223 B |
| 7,486,878 B2 | 2/2009 | Chen et al. | |
| 9,442,482 B2 | 9/2016 | Miner et al. | |

(Continued)

FOREIGN PATENT DOCUMENTS

| TW | 200834211 A | 8/2008 |
|---|---|---|
| TW | 201440980 A | 11/2014 |

OTHER PUBLICATIONS

Official Action dated May 30, 2019, in corresponding Taiwan Patent Application No. 10820503760.

*Primary Examiner* — Saul Rodriguez
*Assistant Examiner* — Brendan P Tighe
(74) *Attorney, Agent, or Firm* — Duane Morris LLP

(57) ABSTRACT

An apparatus for inspecting wafer carriers is disclosed. In one example, the apparatus includes: a housing having an opening on a wall of the housing; a load port outside the housing; a robot arm inside the housing; and a processor. The load port is coupled to the wall and configured to load a wafer carrier for inspection. The robot arm is configured to move a first camera connected to the robot arm. The first camera is configured to capture a plurality of images of the wafer carrier. The processor is configured to process the plurality of images to inspect the wafer carrier.

20 Claims, 20 Drawing Sheets

(56) References Cited

U.S. PATENT DOCUMENTS

2001/0015056 A1* 8/2001 Hiramoto ................ B29C 65/18
                                                    53/479
2018/0232870 A1* 8/2018 Jo ........................... G06T 7/001
2019/0195724 A1* 6/2019 Jo ........................... G01J 5/0022

* cited by examiner

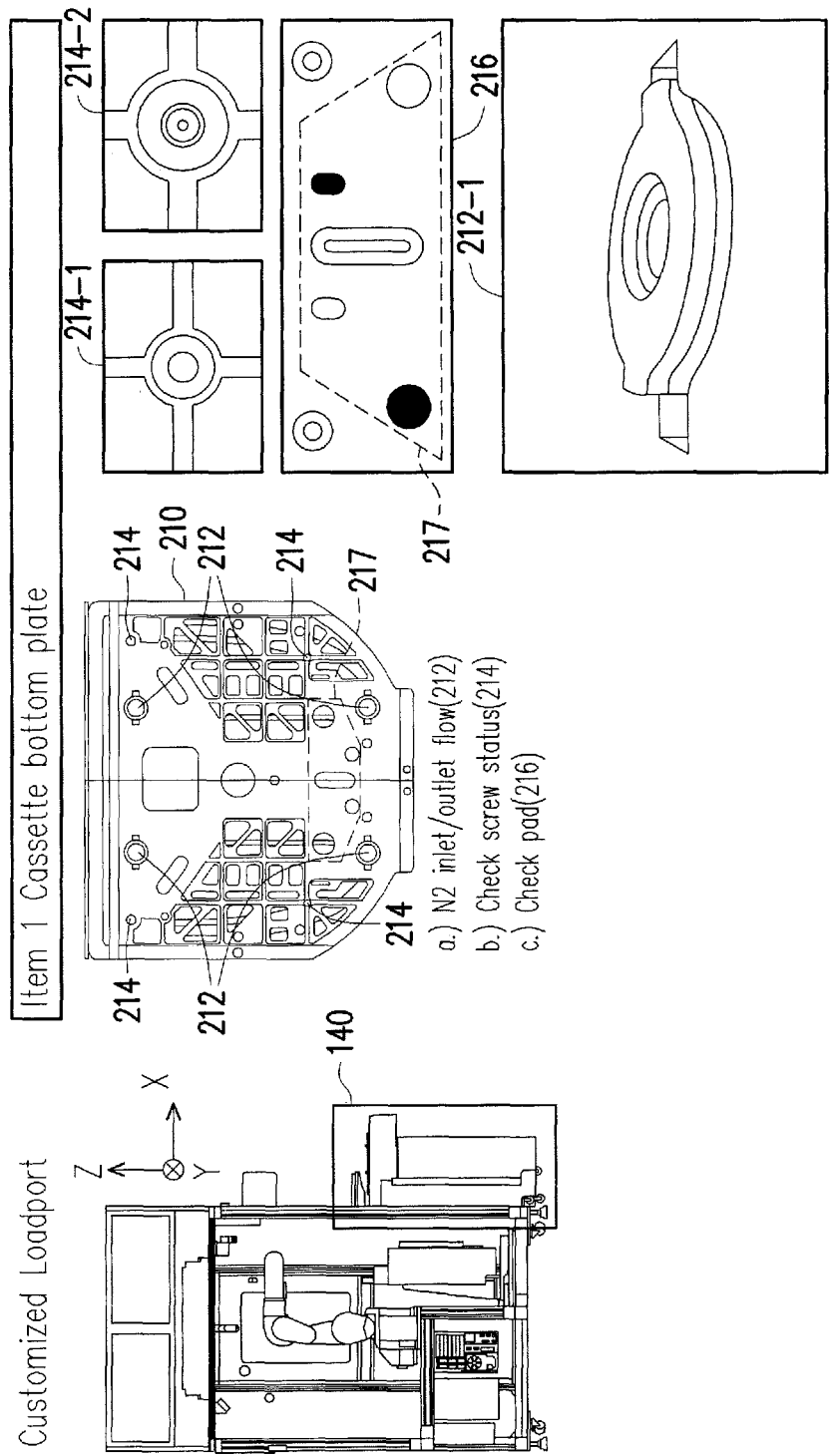

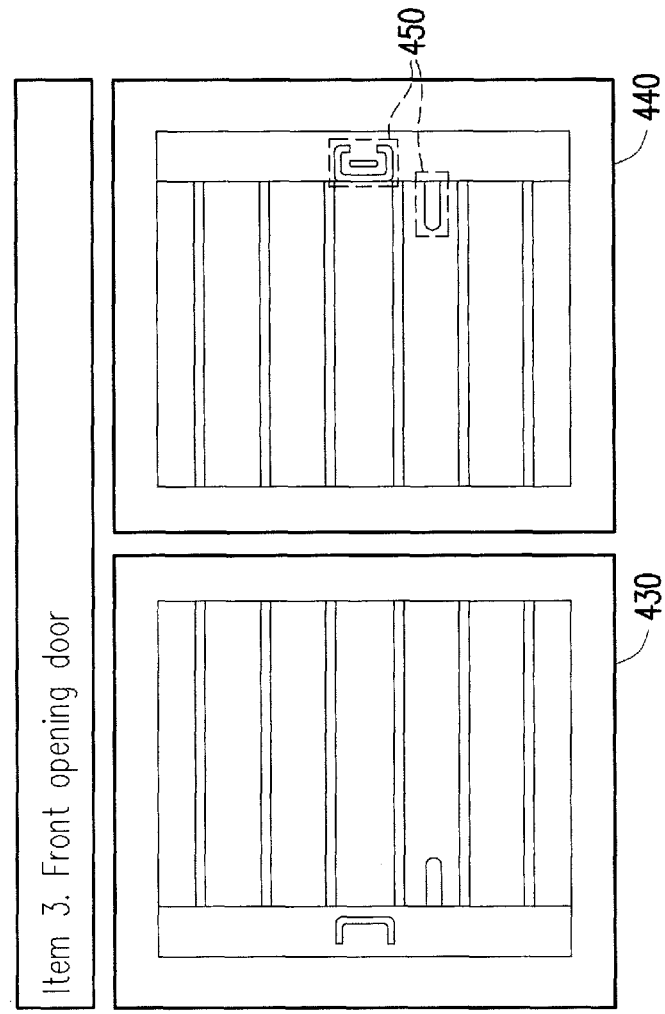
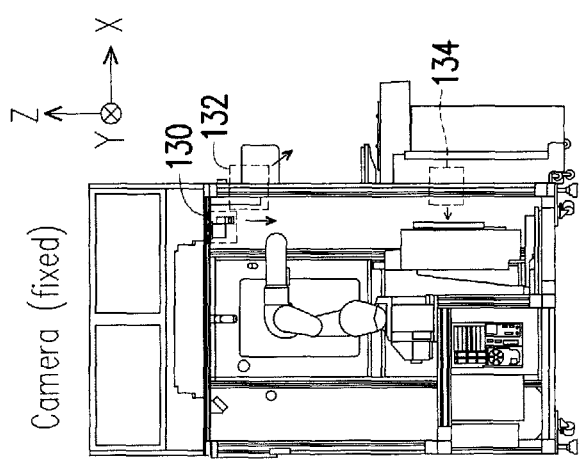
FIG. 4

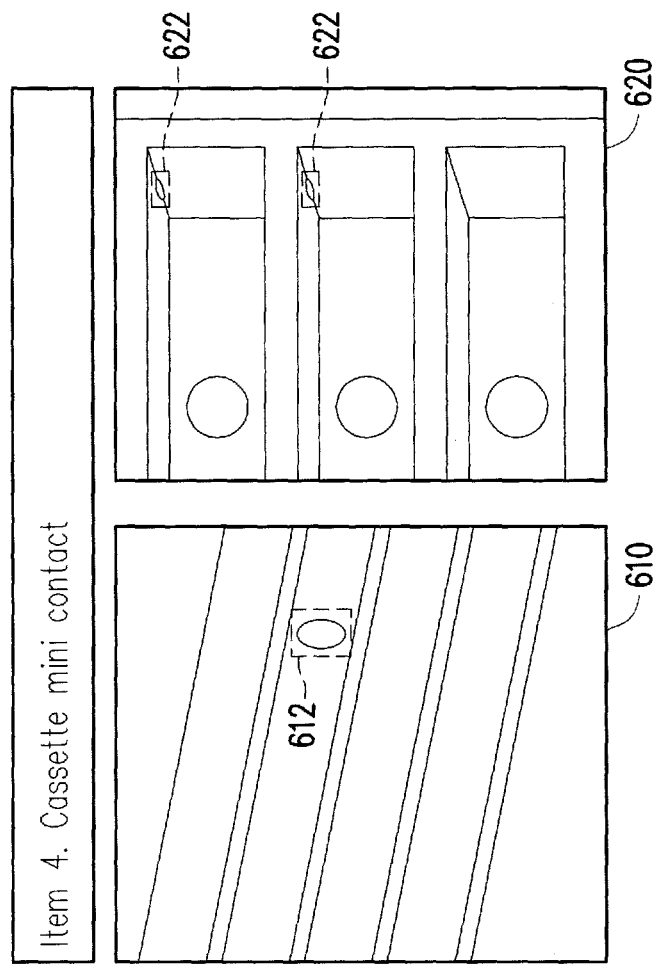
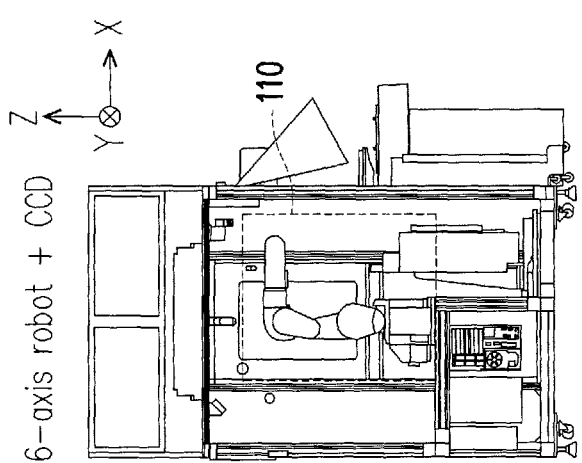
FIG. 6

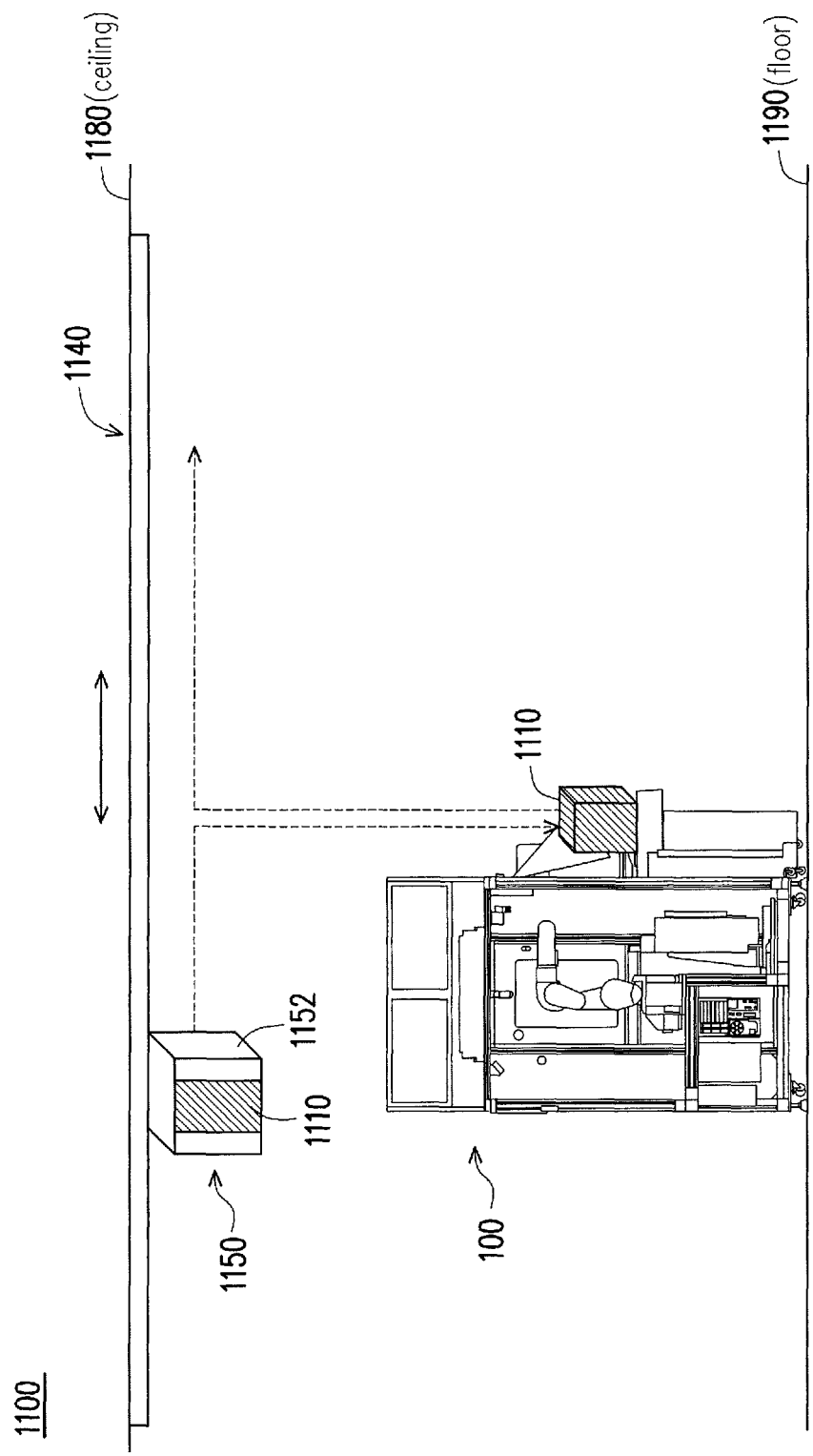

APPARATUS AND METHOD FOR INSPECTING WAFER CARRIERS

CROSS-REFERENCE TO RELATED APPLICATION

The present application claims priority to U.S. Provisional Patent Application No. 62/552,972, filed on Aug. 31, 2017, which is incorporated by reference herein in its entirety.

BACKGROUND

During manufacturing of a semiconductor device, the device is usually processed at many work stations or processing machines. The transporting or conveying of a partially finished device, or a work-in-process (WIP) part, e.g. a semiconductor wafer, is an important aspect in the total manufacturing process. A semiconductor wafer must be stored or transported between various process stations in order to perform various fabrication processes.

Multiple wafers are typically stored and transported together in wafer carriers between load ports of different wafer processing or other tools during the semiconductor fabrication process. The wafer carriers include standard mechanical interface (SMIF) pods which can hold a plurality of wafers (e.g. 200 mm or 8 inch), or front opening unified pods (FOUPs) which can hold larger 300 mm (12 inch) or 450 mm (18 inch) wafers. In general, a wafer carrier is designed to hold at least one wafer. More specifically, the wafer carrier may comprise a plurality of slots each of which can hold one wafer. Typically, a wafer carrier holds on the order of approximately 25 wafers.

An overhead hoist transfer (OHT) system is commonly used to transport wafer carriers, such as FOUPs or SMIFs, from the load port of one tool to the load port of the next tool in the processing sequence. A wafer carrier transported by an OHT transfer system typically has a door during the transfer process for production quality control, e.g. to seal the wafer carrier against entry of external contaminants to keep wafers inside the wafer carrier clean, and/or to protect the wafers from falling off the wafer carrier.

Due to repetitive usage and transportation, a wafer carrier may have quality defects or even catastrophic failures, which will impact quality of wafers held inside the wafer carrier. For example, a wafer carrier may have a broken tenon, a worn out mini-contact, a defect on a latch key groove or a filter. There is no existing tool for inspecting a wafer carrier to detect these wafer carrier defects. As such, an apparatus and method for inspecting wafer carriers is desired.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

FIG. 2 illustrates a load port included in the exemplary wafer carrier inspection device and some wafer carrier inspections performed by the load port, in accordance with some embodiments of the present disclosure.

FIG. 4 illustrates fixed cameras included in the exemplary wafer carrier inspection device and other wafer carrier inspections performed by the fixed cameras, in accordance with some embodiments of the present disclosure.

FIG. 6 illustrates a robot arm included in the exemplary wafer carrier inspection device and other wafer carrier inspections performed by the robot arm having a camera thereon, in accordance with some embodiments of the present disclosure.

FIGS. 7A-7I illustrate wafer carrier inspections performed by an exemplary wafer carrier inspection device, during various inspection stages, in accordance with some embodiments of the present disclosure.

FIG. 11 illustrates a portion of a semiconductor FAB including a wafer carrier transport tool and a wafer carrier inspection device for inspecting wafer carriers, in accordance with some embodiments of the present disclosure.

DETAILED DESCRIPTION

Figure 1A:
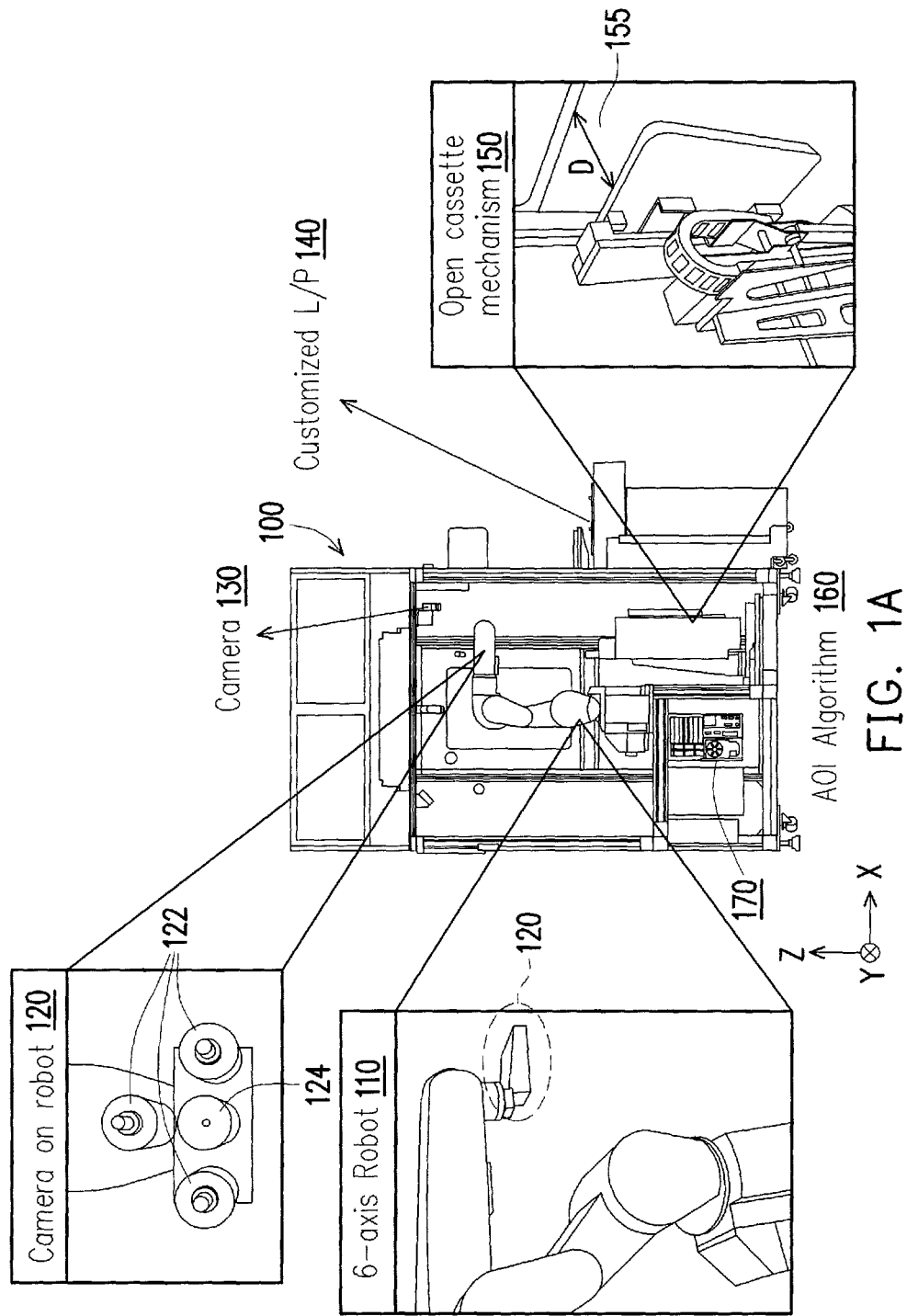
FIG. 1A illustrates an exemplary wafer carrier inspection device including various components, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

A wafer carrier is a typical device for storing, transporting, and processing of the semiconductor wafers. Multiple wafers are typically stored and transported together in wafer carriers between load ports of different wafer processing or other tools during the semiconductor fabrication process. The wafer carriers may be standard mechanical interface (SMIF) pods which can hold a plurality of wafers (e.g. 200 mm or 8 inch), or front opening unified pods (FOUPs) which can hold larger 300 mm (12 inch) or 450 mm (18 inch) wafers, or front opening shipping boxes (FOSBs). In general, a wafer carrier is designed to hold at least one wafer. More specifically, the wafer carrier may comprise a plurality of slots each of which can hold one wafer. Typically, a wafer carrier holds on the order of approximately 25 wafers.

An overhead hoist transfer (OHT) system is commonly used to transport wafer carriers, such as FOUPs or SMIFs, from the load port of one tool to the load port of the next tool in the processing sequence. Due to repetitive usage and transportation, a wafer carrier may have quality defects or catastrophic failures, for example, a broken tenon, a worn out mini-contact, a defect on a latch key groove or a filter, which will impact quality of wafers held inside the wafer carrier.

To timely detect wafer carrier defects, the present disclosure introduces apparatus and methods for automatically and systematically inspecting wafer carriers. In some embodiments, the apparatus integrates a 6-axis robot, one or more cameras, and a load/unload mechanism together to realize an automatic wafer carrier inspection.

In one embodiment, the apparatus includes a housing having an opening on a wall of the housing, a load port outside the housing, a robot arm inside the housing, and a processor. The load port is coupled to the wall and configured to load a wafer carrier through the opening for inspection. The robot arm may have six axes of rotation for moving a first camera connected to the robot arm. The first camera may be a charge coupled device (CCD) camera that is configured to capture a plurality of images of the wafer carrier. The processor can process the plurality of images to inspect the wafer carrier for both quality defects and catastrophic failures, e.g. by applying an automated optical inspection (AOI) algorithm on the plurality of images.

In some embodiments, the load port includes an input table configured to receive the wafer carrier that has a door facing the opening on the wall. The input table is movable relative to the housing along a first direction perpendicular to the wall. The apparatus may further include an opening mechanism inside the housing and configured to open the door of the wafer carrier along the first direction, and move the door along a second direction, that is different from the first direction, to a rest area inside the housing, while the wafer carrier is inspected.

The CCD camera on the robot arm may capture a first image of an exterior side of the door of the wafer carrier before the door is opened and one or more images inside the wafer carrier after the door is opened. Based on these images, the processor can determine at least one of: whether there is a defect on a latch key groove of the door, whether there is a defect on a filter, whether there is a defect or break of a tenon, and whether a mini-contact in the wafer carrier is worn out.

The apparatus may further comprise a second camera inside the housing and located above the opening mechanism. The door is opened up along the first direction for a farther distance than a normal door opening mechanism, e.g., to at least 15 cm away from the wafer carrier, such that the second camera can capture a second image of the door from a top side of the door. The processor is configured to determine whether a sealing strip on the door is worn out based on the second image.

The apparatus may further comprise a third camera inside the housing and located facing the rest area. The third camera can capture a third image of an interior side of the door after the door is moved to the rest area. The processor is configured to determine whether there is a defect on the interior side of the door based on the third image.

The apparatus may further comprise a fourth camera outside the housing and coupled to the wall. The fourth camera can capture an image of a top head of the wafer carrier. The top head is configured for an overhead transport tool, e.g. an OHT system, to pick up and transport the wafer carrier. The processor is configured to determine whether there is a loose or lost screw on the top head and whether the top head is crooked based on the image.

The apparatus may further comprise a closing mechanism configured to move the door back from the rest area along the second direction after inspection; and close the door back onto the wafer carrier along the first direction. In some embodiments, the closing mechanism is a same mechanism as the opening mechanism. In other embodiments, the closing mechanism is a different mechanism from the opening mechanism.

In some embodiments, the load port comprises a sensor configured to generate an image of a bottom plate of the wafer carrier. The processor is configured to perform at least one of: determine whether inlet and outlet flows are smooth on the bottom plate based on the image; determine whether there is a loose or lost screw on the bottom plate based on the image; and check status of an information pad on the bottom plate based on the image.

Upon receiving one or more instructions, the processor may also perform at least one of: switch operation modes of the apparatus between remote and local; switch loading modes of the load port between auto and manual; adjust the robot aim to determine a position and a direction of the first camera; and adjust one or more optical parameters of the first camera.

It is understood that the present disclosure is applicable to an automatic inspection on all kinds of wafer carriers, including but not limited to: SMIFs, FOUPs, and FOSBs. The disclosed apparatus can monitor quality/defect status of a wafer carrier and report the status to an upper level system in real time, e.g. in several seconds. The disclosed apparatus can apply an automatic quantified standard on the inspection result to determine the status of the wafer carrier, instead of relying on a manual judgment of a human being. Because a wafer carrier defect will impact quality of semiconductor wafers, the disclosed automatic wafer carrier inspection method can improve semiconductor production yield by timely detecting wafer carrier defects, reducing usages of defected wafer carriers, and/or fixing the wafer carrier defects in time.

Figure 1B:
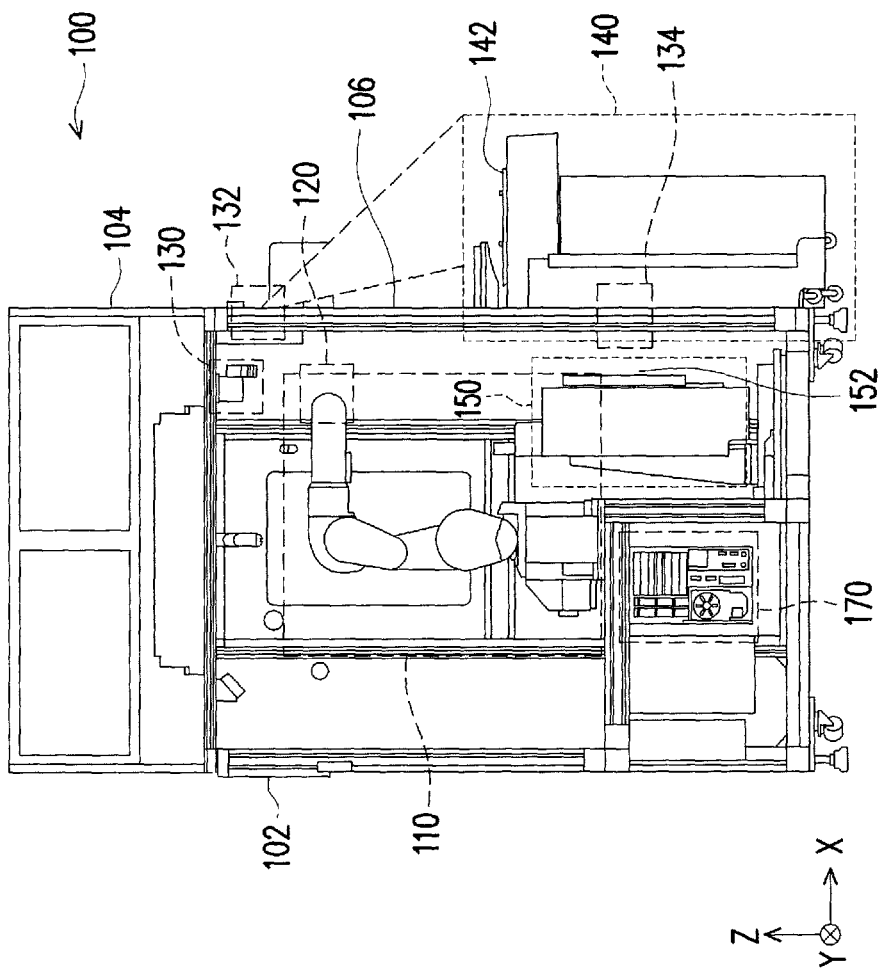
FIG. 1B illustrates a detailed side perspective view of the exemplary wafer carrier inspection device shown in FIG. 1A, in accordance with some embodiments of the present disclosure.

FIG. 1A illustrates an exemplary wafer carrier inspection device 100 including various components, in accordance with some embodiments of the present disclosure. FIG. 1B illustrates a detailed side perspective view of the exemplary wafer carrier inspection device 100 shown in FIG. 1A, in accordance with some embodiments of the present disclosure. As shown in FIG. 1A and FIG. 1B, the exemplary wafer carrier inspection device 100 includes a robot arm 110, a camera 120 on the robot arm, a fixed camera 130, a load port 140, an opening mechanism 150, and a processor 170 which can implement an AOI algorithm 160 to perform automatic wafer carrier inspection.

The wafer carrier inspection device 100 in this example includes a housing 102 having an opening 106 on a wall 104 of the housing 102. The load port 140 is located outside the housing 102 and coupled to the wall 104. The load port 140 includes an input table 142 configured to receive a wafer carrier (not shown in FIG. 1A or FIG. 1B) that has a door facing the opening 106 on the wall 104. During the inspection, the wafer carrier includes no wafer inside. The input table 142 is movable relative to the housing 102 at least along a first direction perpendicular to the wall 104, i.e. along the –X direction as shown in FIG. 1B.

In some embodiments, the load port 140 may be customized to include a sensor configured to generate an image of a bottom plate of the wafer carrier placed on the table 142. The image may be used to determine whether inlet and outlet flows are smooth on the bottom plate, determine whether there is a loose or lost screw on the bottom plate, and check status of an information pad on the bottom plate.

While the wafer carrier is placed on the input table 142, a camera 132 located outside the housing 102 and coupled to the wall 104 can capture an image of a top head of the wafer carrier. The camera 132 is located above a carrier when the carrier is placed on the table 142. The top head is configured for an overhead transport tool, e.g. an OHT, to pick up and transport the wafer carrier. Based on this image, the processor 170 can determine whether there is a loose or lost screw on the top head and whether the top head is crooked.

The load port 140 can load the wafer carrier for inspection. While being loaded, the door of the wafer carrier may be moved along the –X direction to go inside the housing 102, such that the opening mechanism 150 can open the door of the wafer carrier. The camera 120 on the robot arm 110 can capture an image of an exterior side of the door of the wafer carrier before the door is opened. Based the image, the processor 170 can determine whether there is a defect on a latch key groove of the door based on the first image.

The opening mechanism 150 is located inside the housing 102 and can move along the Z/–Z (up and down) and X/–X (forward and backward) directions relative to the housing 102. In this example, to open the door of the wafer carrier, the opening mechanism 150 may first move up, along the Z direction, to be aligned with the door on a same height. The opening mechanism 150 can then move forward, along the X direction, to be coupled to the door, and open the door, e.g. with a latch key. After opening the door, the opening mechanism 150 can move backward, along the –X direction, to detach the door from the wafer carrier, and then move the door down, along the –Z direction, to a rest area 152 inside the housing 102. The door is held in the rest area 152 while the inside of the wafer carrier is inspected by the camera 120 on the robot arm 110.

It is understood that once the door can be fit into the opening 106, a location of the door along the Y direction is fixed, such that the opening mechanism 150 can be pre-configured to fit the same location on the Y direction and there is no need for the opening mechanism 150 to adjust its Y axis for every loaded wafer carrier. In one embodiment, upon receiving an instruction, the processor 170 may adjust the Y axis of the opening mechanism 150.

The wafer carrier inspection device 100 may also include a camera 130 located inside the housing 102 and above the opening mechanism 150. The fixed camera 130 is coupled to the housing 102 and located above a door of a carrier when the carrier is placed on the table 142 and fit into the opening 106. The camera 130 can capture an image of the door from a top side of the door when the door is opened up by the opening mechanism 150. To have a clear image of a top view of the door, the opening mechanism 150 can move the door backward, along the –X direction, for a farther distance D 155 from the wafer carrier than a normal door opening mechanism, e.g., D 155 may be at least 15 cm. Based on the image, the processor 170 can determine whether a sealing strip on the door is worn out.

The wafer carrier inspection device 100 may also include a camera 134 located inside the housing 102 and facing the rest area 152. The camera 134 is coupled to the housing 102 and located under a door of a carrier when the carrier is placed on the table 142 and fit into the opening 106, facing the rest area 152 where the door will be moved to for inspection. The camera 134 is configured to capture an image of an interior side of the door after the door is moved to the rest area 152. Based on the image, the processor 170 can determine whether there is a defect on the interior side of the door.

The robot arm 110 in this example is located within the housing 102 and has six axes of rotation for moving the camera 120. The robot arm 110 may be called a "6-axis robot," and it can move the camera 120 along X, –X, Y, –Y, Z, and –Z directions as shown in FIG. 1B. After the door is opened and moved to the rest area 152, the robot arm 110 can move the camera 120 connected to the robot arm 110 along any of the six directions, to capture images of the inside of the wafer carrier, at different locations and from different angles. Based on these images, the processor 170 can determine whether there is a defect on a filter, whether there is a defect or break of a tenon, and whether a mini-contact in the wafer carrier is worn out. In some embodiments, the camera 120 may include three flash lights 122 around a lens 124, to provide good light for image capturing at different locations.

The processor 170 in this example is located in the housing 102 and below the robot arm 110. It is understood that the processor 170 may be located in other places of the wafer carrier inspection device 100 for design convenience. The processor 170 may be electrically connected to the cameras of the wafer carrier inspection device 100 to receive the images captured by the cameras. The processor 170 can implement an AOI algorithm 160 on the captured images to perform automatic wafer carrier inspection.

After the inspection, the opening mechanism 150 may close the door onto the wafer carrier, by: moving up the door from the rest area 152, along the Z direction, to be aligned with the wafer carrier on a same height; moving forward the door, along the X direction; and closing the door onto the wafer carrier, e.g. with a latch key.

The processor 170 may automatically report the inspection result of the wafer carrier to an upper level system, e.g. to an administrator or an IT department. The upper level system may determine where to send the wafer carrier.

In one embodiment, based on the inspection result, the processor 170 can automatically determine whether to send the wafer carrier. For example, when the wafer carrier fails the inspection, i.e. the inspection result not passing a predetermined standard or threshold, the wafer carrier may be sent to a factory room for fixing the defects. When the passes the inspection, i.e. the inspection result passing a predetermined standard or threshold, the wafer carrier may be sent to a wafer room for carrying and transporting wafers.

In another embodiment, the processer 170 will automatically send the wafer carrier to a wafer room for carrying and transporting wafers if the wafer carrier passes the inspection, but will report to the upper level and wait for further instruction when the wafer carrier fails the inspection.

FIG. 2 illustrates a load port 140 included in the exemplary wafer carrier inspection device 100 and some wafer carrier inspections performed by the load port 140, in accordance with some embodiments of the present disclosure. As discussed above, the load port 140 may include a sensor to capture images of the bottom plate 210 of the wafer carrier, from bottom up along the Z direction. As shown in FIG. 2, the bottom plate 210 includes flow inlets/outlets 212. The sensor can detect whether flows through the inlets/outlets 212 are smooth on the bottom plate 210, e.g. based on an image 212-1 or based on flow pressure sensing. For example, there is a defect on the flow inlet/outlet that is not flat and not fit well, as shown in the image 212-1.

Based on the images 214-1, 214-2 captured by the sensor, the processor 170 can check status of the screws 214 on the bottom plate 210, to see whether there is a loose or lost screw on the bottom plate 210. For example, a screw is missing on the bottom plate 210, as shown in the image 214-1.

Based on an image 216 of a pad on the bottom plate 210, the processor 170 can check whether the wafer carrier is marked correctly on the pad. In this embodiment, the pad is an information pad that includes four holes 217, numbered A, B, C, D respectively. By plugging zero or one or more holes of the four holes 217, the wafer carrier can be marked differently according to different stages the wafers in the wafer carrier is at during the semiconductor fabrication process. All wafers in a wafer carrier should be at a same stage during the semiconductor fabrication process, i.e. having same layers already deposited on and waiting for a same layer to be formed on. The status of the pad on the wafer carrier, represented by a combination of plugging/unplugging of the holes A, B, C, D 217 on the pad, should correspond to the correct stage of the wafers in the wafer carrier. Having information from a pre-configured table, the processor 170 can determine whether the status of an pad is correct or not, based on an analysis of the image 216. If the status of the pad is not matching its wafer carrier ID in the pre-configured table, the processor 170 will report this error. Then one can check whether the error is due to a wrongly installation of the wafers or a wrongly plugging/unplugging of the holes A, B, C, D 217 on the pad, and fix the error accordingly.

Figure 3:
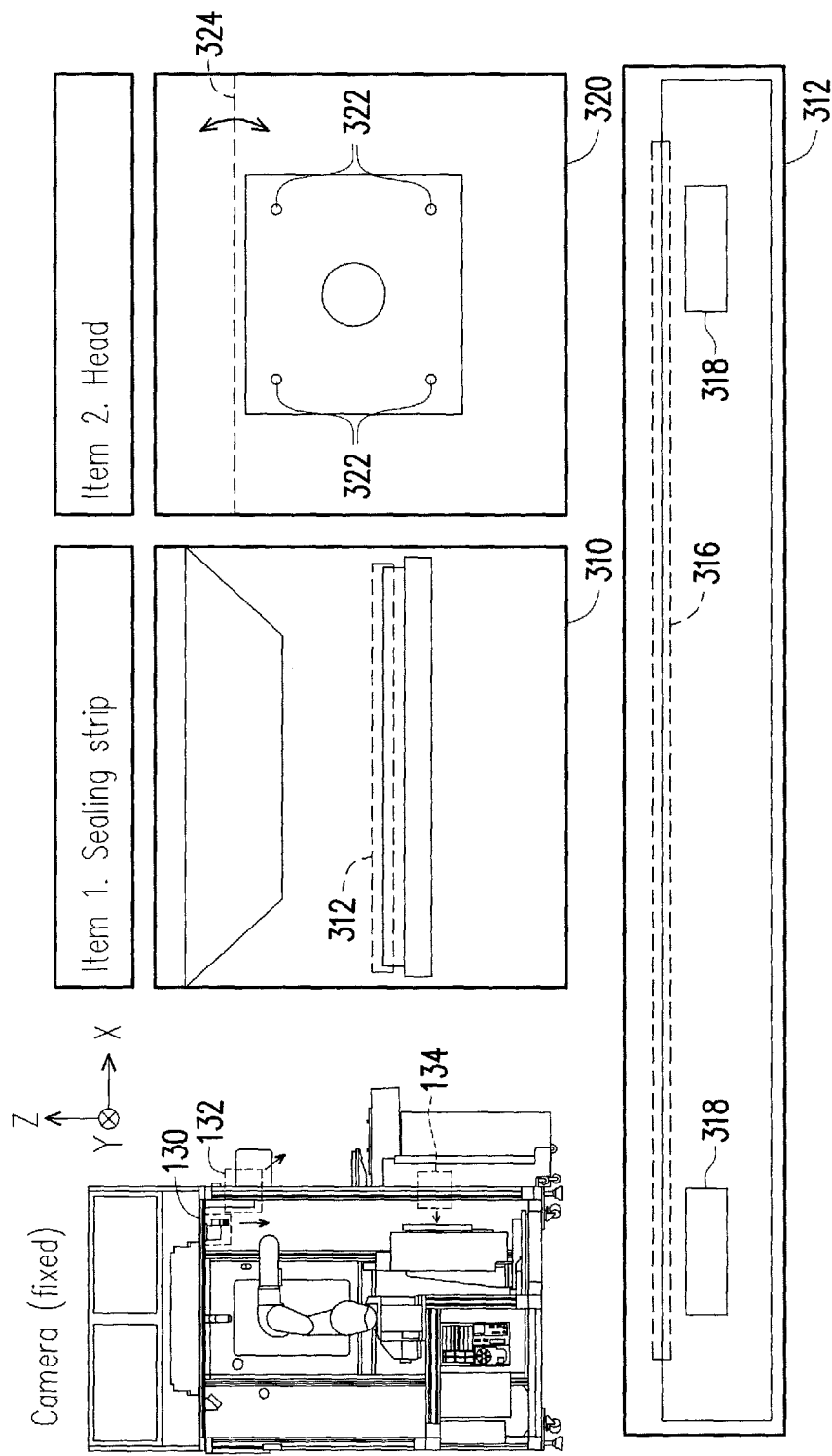
FIG. 3 illustrates fixed cameras included in the exemplary wafer carrier inspection device and some wafer carrier inspections performed by the fixed cameras, in accordance with some embodiments of the present disclosure.

FIG. 3 illustrates fixed cameras 130, 132, 134 included in the exemplary wafer carrier inspection device 100 and some wafer carrier inspections performed by the fixed cameras, in accordance with some embodiments of the present disclosure. As discussed above, the fixed camera 130 is located inside the housing 102 and above the opening mechanism 150, to capture an image 310 of the door from a top side of the door when the door is opened up by the opening mechanism 150, from top down along the −Z direction. A sub-image 312 in the image 310 is enlarged in FIG. 3 to show a sealing strip on the door. Based on the sub-image 312, the processor 170 can determine whether there is a defect on the sealing strip or the tenons 318.

In one embodiment, the processor 170 can perform image processing on the captured images, e.g. the sub-image 312, based on an AOI algorithm For example, by measuring the thickness of the sealing strip on the sub-image 312 with reference points and/or reference lines, some protrusion or unevenness 316 can be detected.

The camera 132 is located outside the housing 102 and above the table of the load port, to capture an image 320 of a top head of the wafer carrier, from top down along the −Z direction. The top head is configured for an overhead transport tool, e.g. an OHT, to pick up and transport the wafer carrier. As such, if there is a loose or lost screw on the top head and/or if the top head is crooked, there is a risk for the wafer carrier to fall off the OHT during transportation. The processor 170 can perform image processing on the image 320, based on an AOI algorithm. For example, with reference points and/or reference lines, the processor 170 can determine whether the top head, which has a square shape, is straight along the reference line 324 or is crooked or twisted relative to the wafer carrier. The processor 170 can also detect whether any of the screws 322 on the top head is loose or lost, based on measurement on the image 320. To detect a defect, the processor 170 may either compare the measurement result with a predetermined threshold, or compare the captured image with a control image that is stored as a reference to a no-defect scenario.

FIG. 4 illustrates fixed cameras 130, 132, 134 included in the exemplary wafer carrier inspection device 100 and other wafer carrier inspections performed by the fixed cameras, in accordance with some embodiments of the present disclosure. As discussed above, the camera 134 is fixed inside the housing 102 and facing the rest area 152, to capture images 430, 440 of an interior side of the door after the door is moved to the rest area 152, along the −X direction. The processor 170 can detect defects of the interior side of the door with the reference lines 450, by either comparing a measurement result with a predetermined threshold, or comparing each captured image with a control image that is stored as a reference to a no-defect scenario.

Figure 5:
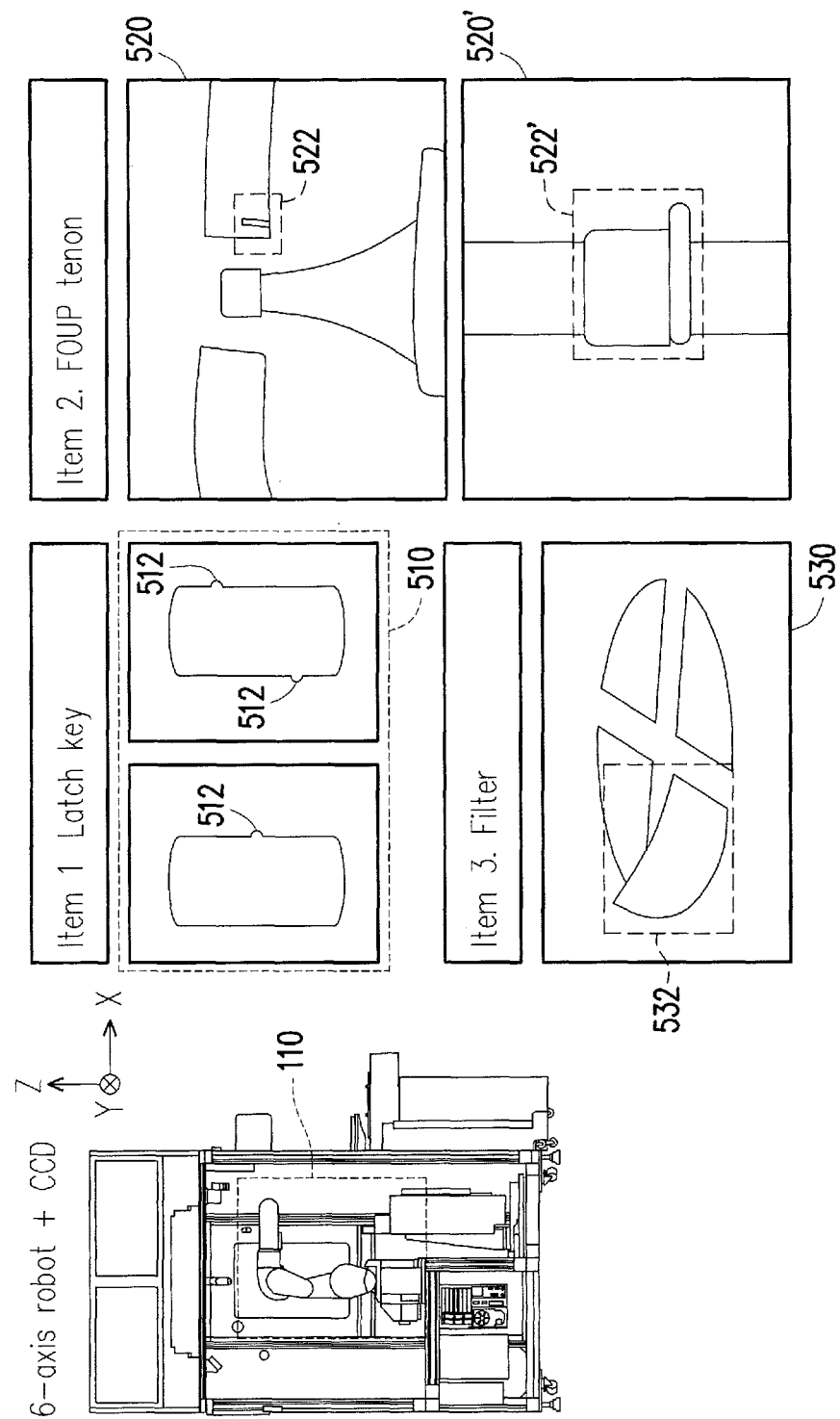
FIG. 5 illustrates a robot arm included in the exemplary wafer carrier inspection device and some wafer carrier inspections performed by the robot arm having a camera thereon, in accordance with some embodiments of the present disclosure.

FIG. 5 illustrates a robot arm 110 included in the exemplary wafer carrier inspection device 100 and some wafer carrier inspections performed by the robot arm having a camera thereon, in accordance with some embodiments of the present disclosure. As discussed above, the robot arm 110 is located within the housing 102 and has six axes of rotation for moving the camera 120 to capture images of the wafer carrier at different locations and/or from different angles.

The camera 120 may capture an image 510 of latch keys (or say latch key grooves) on an exterior side of the door, before the door is opened. Based on the image 510, the processor 170 can detect defects (e.g. unevenness or scratches 512) on the latch key grooves, by either comparing a measurement result with a predetermined threshold, or comparing each captured image with a control image that is stored as a reference to a no-defect scenario.

The camera 120 may capture images 520, 520' of tenons of the wafer carrier. Based on the images 520, 520', the processor 170 can detect defects (e.g. breaking or scratches) on the tenons, with reference lines 522, 522'. The camera 120 may capture an image 530 of a filter located on the bottom of and inside the wafer carrier. Based on the image 530, the processor 170 can detect defects (e.g. stock or clog) on the filter, with reference lines 532.

FIG. 6 illustrates a robot arm 110 included in the exemplary wafer carrier inspection device 100 and other wafer carrier inspections performed by the robot arm having a camera thereon, in accordance with some embodiments of the present disclosure. As shown in FIG. 6, the camera 120 may capture images 610, 620 of mini-contacts in the wafer carrier. Based on the images 610, 620, the processor 170 can detect defects (e.g. a worn out or melt down) on the mini-contacts, with reference lines 612, 622.

After the processor 170 detects any of the above mentioned defects, the processor 170 may report to an upper level system to hold the wafer carrier from carrying any wafers for a time period, until the detected defects are fixed.

FIGS. 7A-7I illustrate wafer carrier inspections performed by an exemplary wafer carrier inspection device 700, during various inspection stages, in accordance with some embodiments of the present disclosure. In some embodiments, the wafer carrier inspection device 700 may have a similar structure as the wafer carrier inspection device 100 as shown in FIGS. 1-6.

Figure 7A:
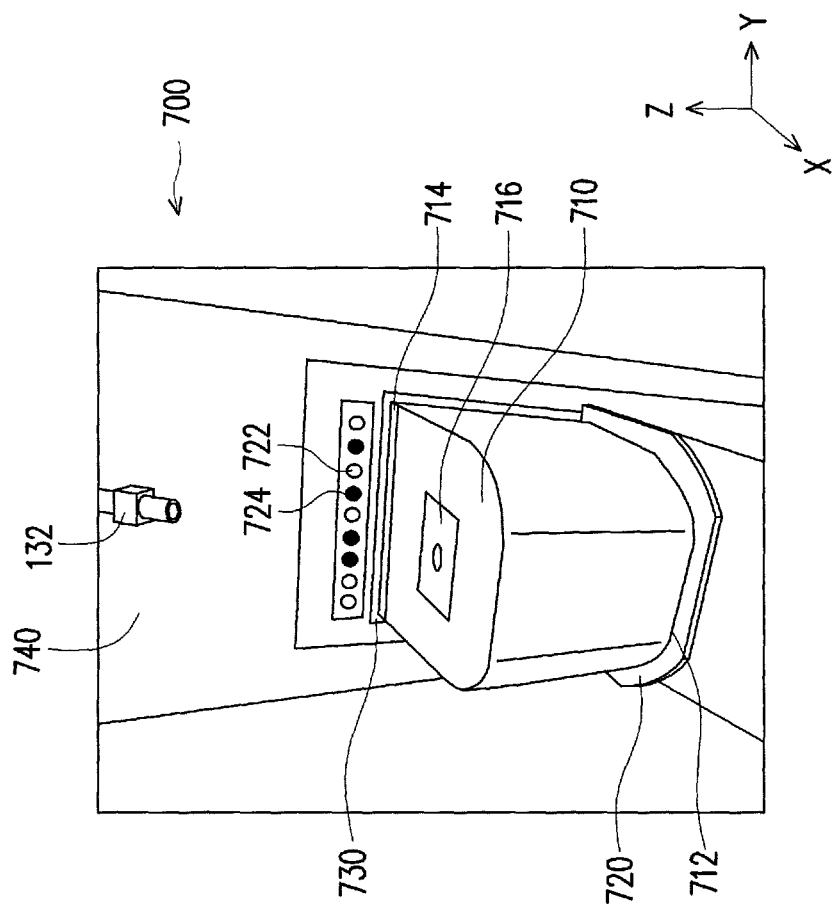
Figure 7B:
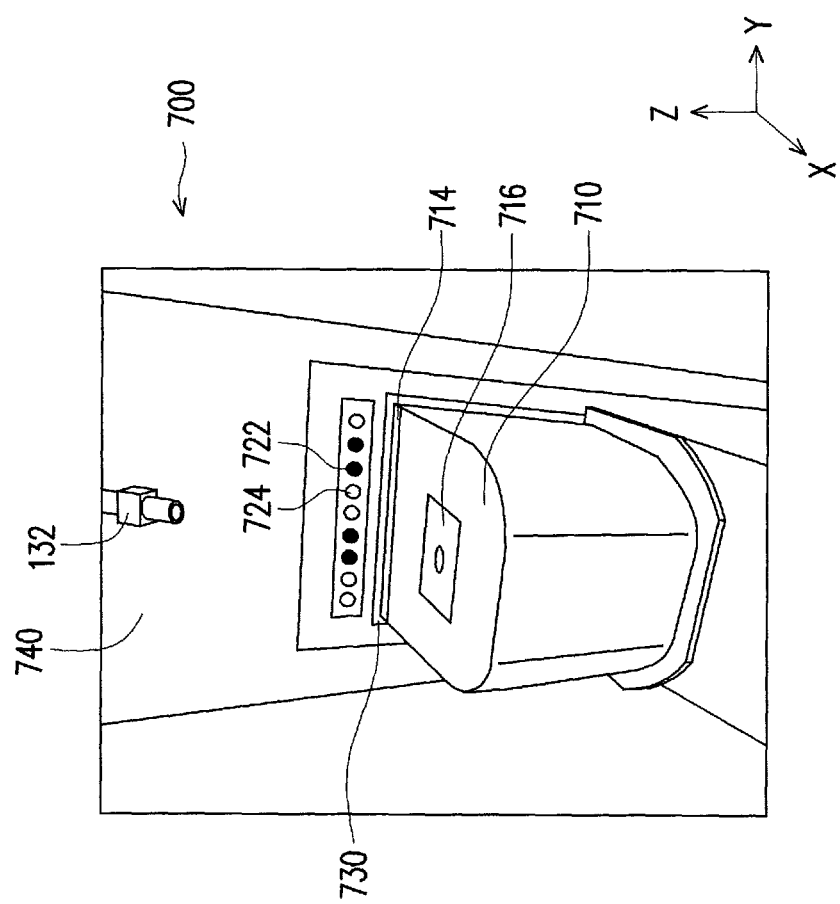

As shown in FIG. 7A and FIG. 7B, a wafer carrier 710 is placed onto a table 720 of the wafer carrier inspection device 700, e.g. by an OHT. The wafer carrier 710 has a bottom plate 712 at the bottom of the wafer carrier 710, and a door 714 facing an opening 730 on a wall 740 of the wafer carrier inspection device 700. The wafer carrier inspection device 700 has a sensor coupled to the table 720 and configured to inspect the bottom plate 712. The wafer carrier inspection device 700 also has a camera 132 outside the wall 740 to capture an image of the top head 716 of the wafer carrier 710, to inspect the top head 716.

At the stage shown in FIG. 7A, the bottom plate 712 is being inspected by the sensor, with an indicator light 722 being turned on and an indicator light 724 being turned off. At the stage shown in FIG. 7B, the bottom plate 712 has been inspected and the wafer carrier 710 has been moved toward the opening 730, along the −X direction, and the top head 716 is being inspected by the outside camera 132, with an indicator light 722 being turned off and an indicator light 724 being turned on.

Figure 7C:
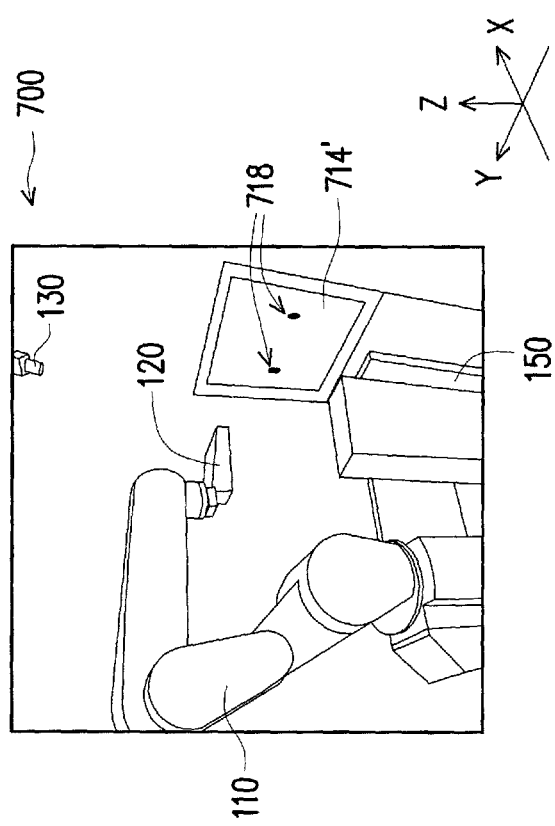

FIGS. 7C-7I illustrate an inside view of the housing of the wafer carrier inspection device 700. As shown in FIG. 7C, there are two latch key grooves 718 on the exterior side of the door 714', where the door 714' has been fit into the opening 730. At the stage shown in FIG. 7C, the robot arm 110 is moving the camera 120 connected to the robot arm 110 to capture images, toward the X direction, of the exterior side of the door 714', e.g. to inspect the latch key grooves 718.

Figure 7D:
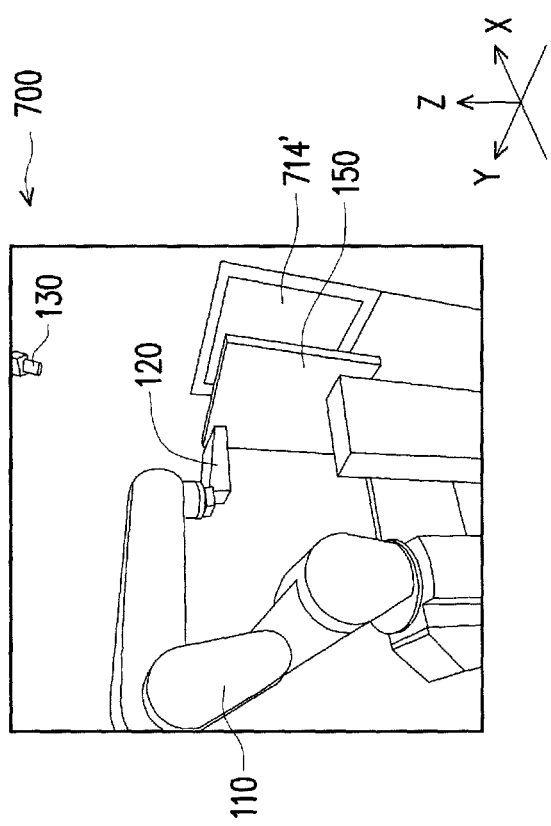
Figure 7E:
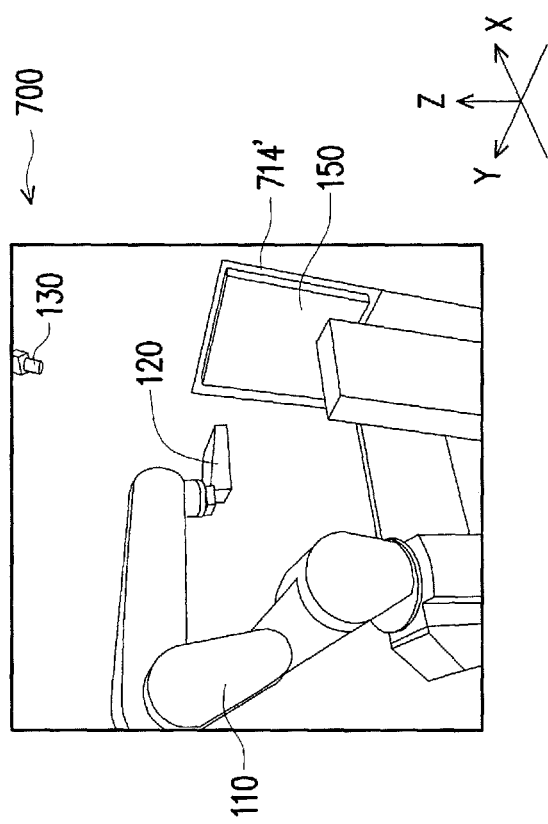

As shown in FIG. 7D, the opening mechanism 150, which was originally located below the door 714', moves up along the Z direction to be aligned with the door 714'. At the stage shown in FIG. 7E, the opening mechanism 150 is moving forward along the X direction to be coupled to the door 714'. In one embodiment, the opening mechanism 150 includes a pair of latch keys corresponding to the pair of latch key grooves 718, and includes a pair of vacuum pins corresponding to a pair of suction holes on the door 714'. When the opening mechanism 150 moves toward the door 714' along the X direction, the pair of latch keys are inserted into the pair of latch key grooves 718, and the pair of vacuum pins are inserted into the pair of suction holes. Each vacuum pin may include a vacuum hole through which a vacuum pressure is applied, when the vacuum pin is inserted into a corresponding suction hole on the door 714'. Based on the vacuum pressure, the door 714' is sucked to and held by the opening mechanism 150, such that the opening mechanism 150 can move with the door 714' after the door 714' is unlocked or opened. Before or after the door 714' is pulled against the opening mechanism 150, the pair of latch keys can be used to rotate the lock on the door 714', e.g. by 90°, to unlock the door 714'.

Figure 7F:
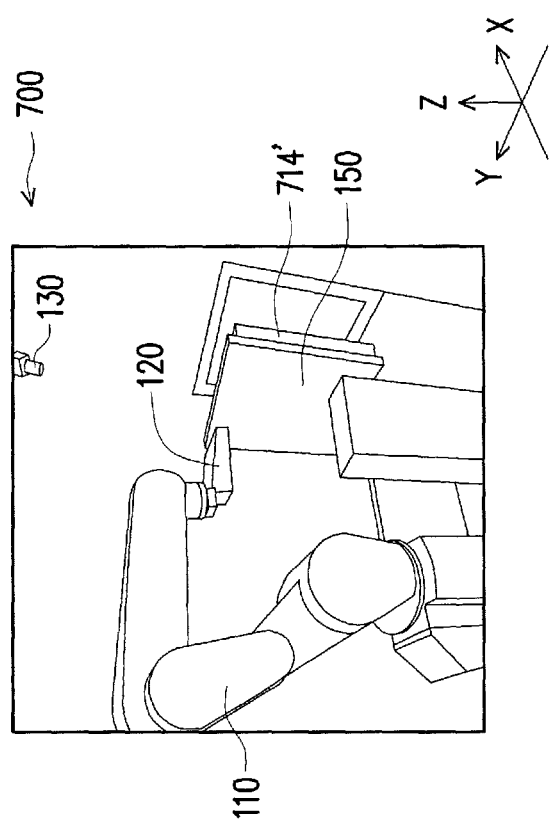
Figure 7G:
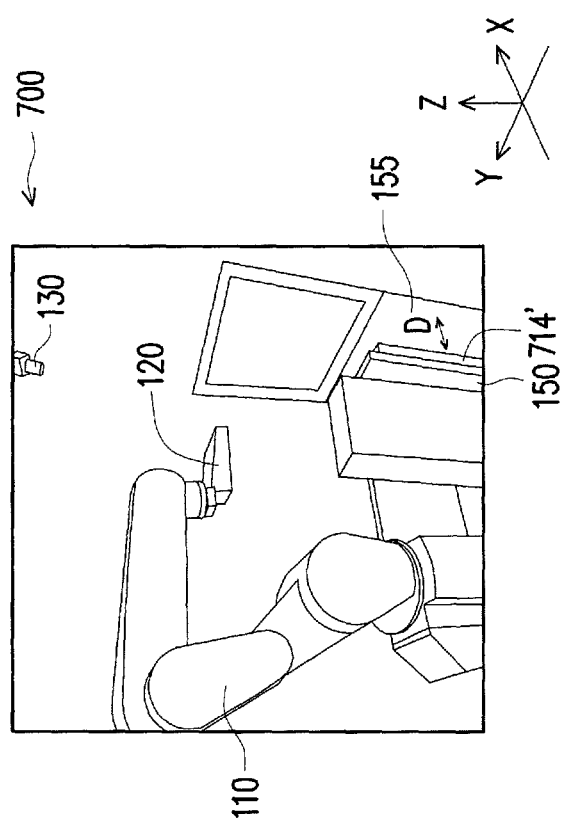

At the stage shown in FIG. 7F, the opening mechanism 150 is moving backward along the −X direction with the attached door 714'. At the stage shown in FIG. 7G, the opening mechanism 150 is moving down the door 714' along the −Z direction, where the fixed camera 130 on top of the opening mechanism 150 captures an image of the door 714' to inspect e.g. the sealing strip. To have a clear image of a top view of the sealing strip, the opening mechanism 150 can move the door backward, along the −X direction, for a farther distance D 155 from the wafer carrier than a normal door opening mechanism, e.g., D 155 may be at least 15 cm.

Figure 7H:
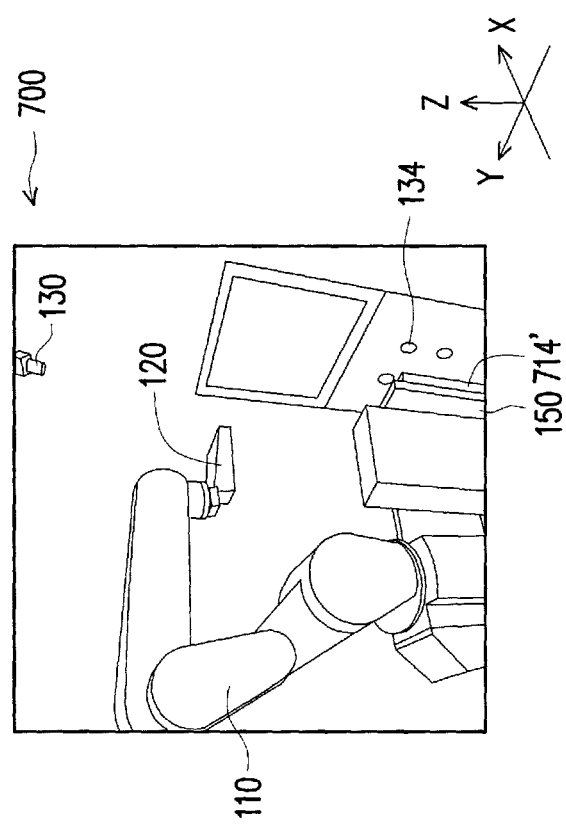
Figure 71:
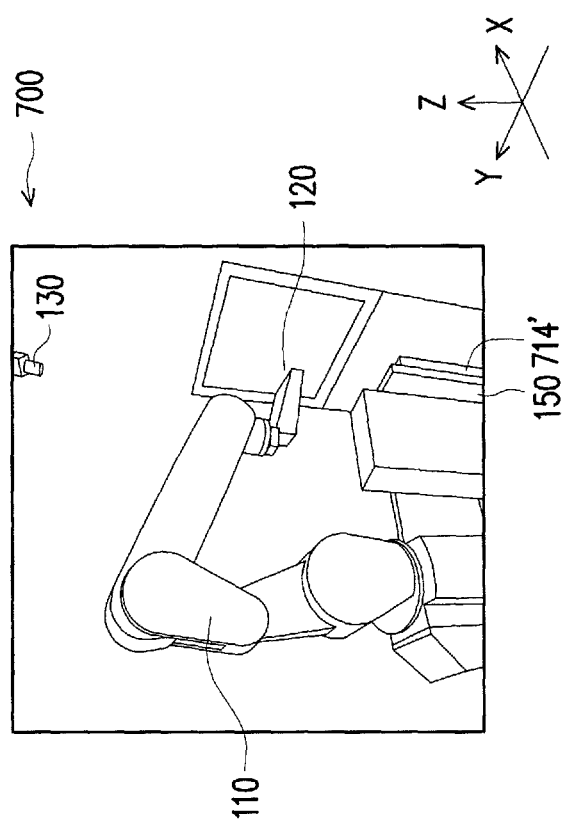

As shown in FIG. 7H, a camera 134 is embedded in the load port and facing the rest area where the door 714' is held after the door 714' is opened. At the stage shown in FIG. 7H, the camera 134 is capturing images of the interior side of the door 714' toward the −X direction, e.g. to inspect the interior side of the door 714'.

At the stage shown in FIG. 7I, the robot arm 110 is making use of its high movement flexibility to move the camera 120 connected to the robot arm 110, to capture images of various parts inside the wafer carrier 710. The wafer carrier inspection device 700 may include a processor to perform image processing on all of the captured images from the cameras, e.g. based on an AOI algorithm. In one embodiment, it costs the wafer carrier inspection device 700 about 3.5 minutes to perform an inspection on a FOUP carrier. After the inspection, the wafer carrier inspection device 700 can automatically report the inspection result.

Figure 8:
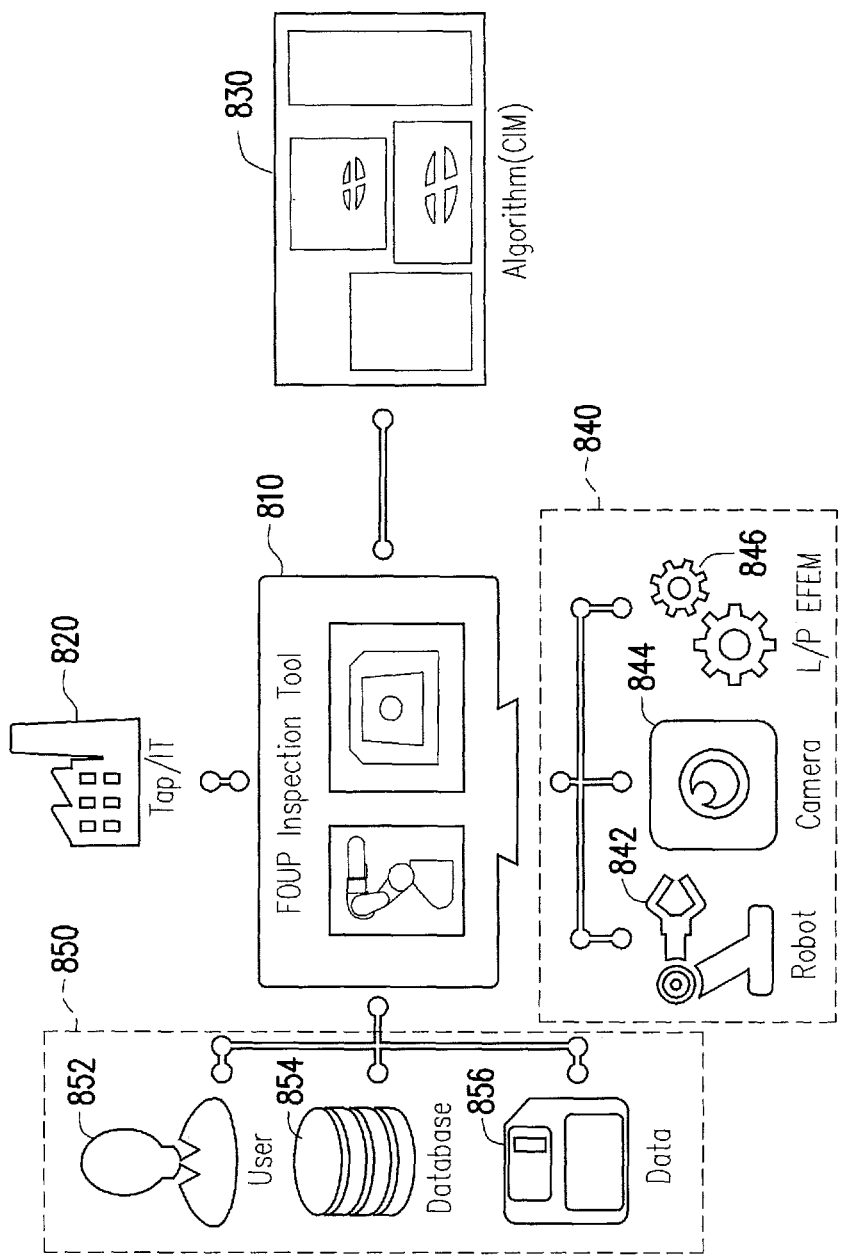
FIG. 8 illustrates different components for inspecting wafer carriers, in accordance with some embodiments of the present disclosure.

FIG. 8 illustrates different components for inspecting wafer carriers, in accordance with some embodiments of the present disclosure. As shown in FIG. 8, a device 840 including a robot 842, one or more cameras 844, and a load port 846, can be used to perform wafer carrier inspection as discussed above. The device 840 may have a similar structure as the wafer carrier inspection device 100 shown in FIGS. 1-6, or a similar structure as the wafer carrier inspection device 700 shown in FIGS. 7A-7I.

An upper level system 850, including a user 852, a database 854, and data 856, can monitor and control the operation of the device 840, via an interface 810. For example, the upper level system 850 can generate or update the algorithm 830 implemented by the device 840, via the interface 810. For example, the user 852 can instruct the device 840, via the interface 810, to switch operation modes of the apparatus between remote and local; switch loading modes of the load port between auto and manual; adjust the robot arm to determine a position and a direction of a camera connected to the robot arm; or adjust one or more optical parameters of the camera.

If the inspection result indicates a detection of a defect or failure of the wafer carrier, the device 840 may report, via the interface 810, to the upper level system 850 or to an IT department, about the defect or failure, and wait for further instruction, e.g. to send the wafer carrier for repair.

Figure 9:
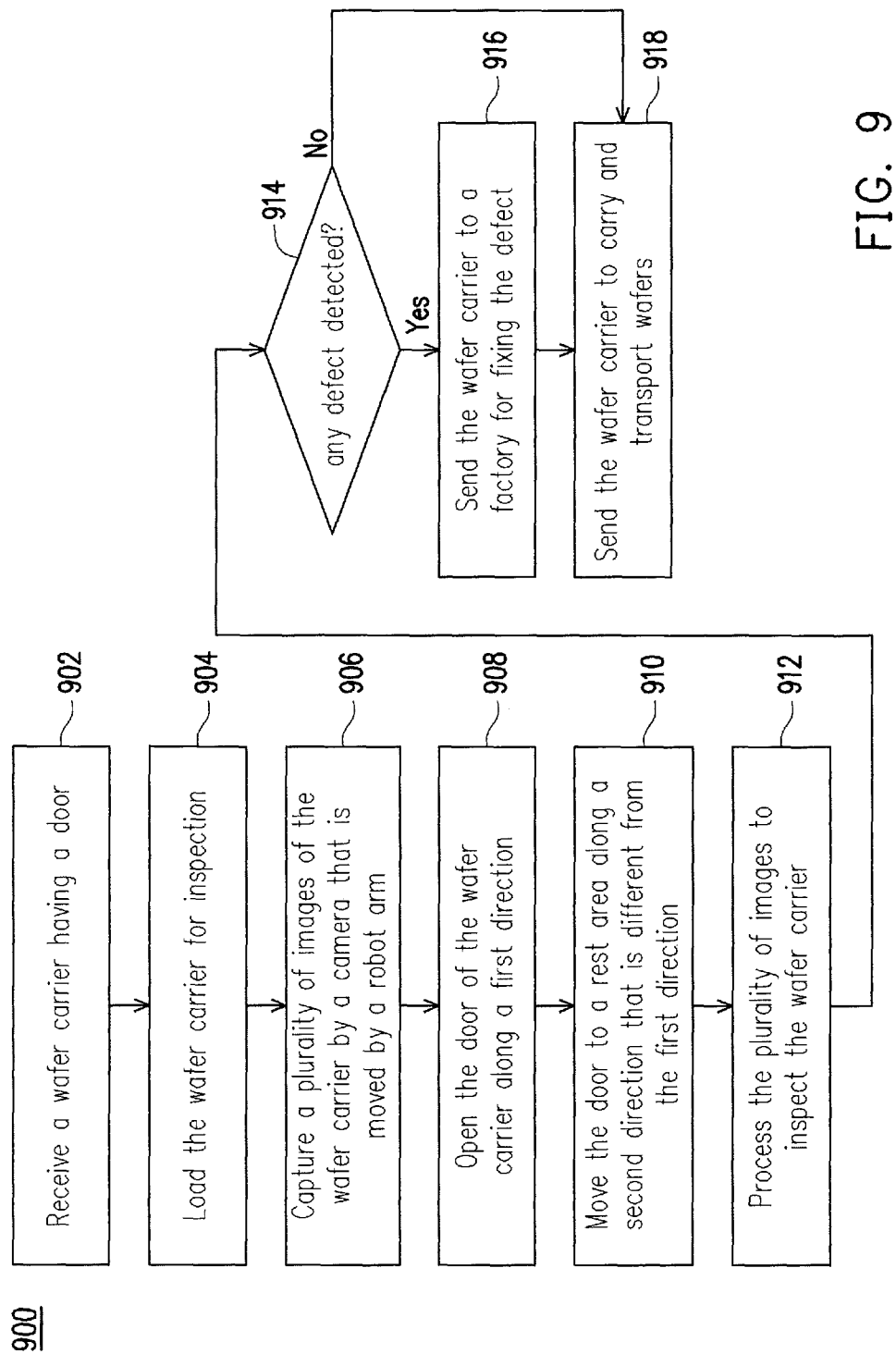
FIG. 9 is a flow chart illustrating an exemplary method for inspecting wafer carriers, in accordance with some embodiments of the present disclosure.

FIG. 9 is a flow chart illustrating an exemplary method 900 for inspecting wafer carriers, in accordance with some embodiments of the present disclosure. As shown in FIG. 9, a wafer carrier having a door is received at 902. The wafer carrier is loaded at 904 for inspection. A plurality of images of the wafer carrier is captured at 906 by a camera that is moved by a robot arm. The door of the wafer carrier is opened at 908 along a first direction. The door is moved at 910 to a rest area along a second direction that is different from the first direction. The plurality of images are processed at 912 to inspect the wafer carrier. If any defect is detected at 914, the wafer carrier is sent to a factory for fixing the defects at operation 916. If no defect is detected at 914, the wafer carrier is sent to carry and transport wafers at operation 918.

Figure 10:
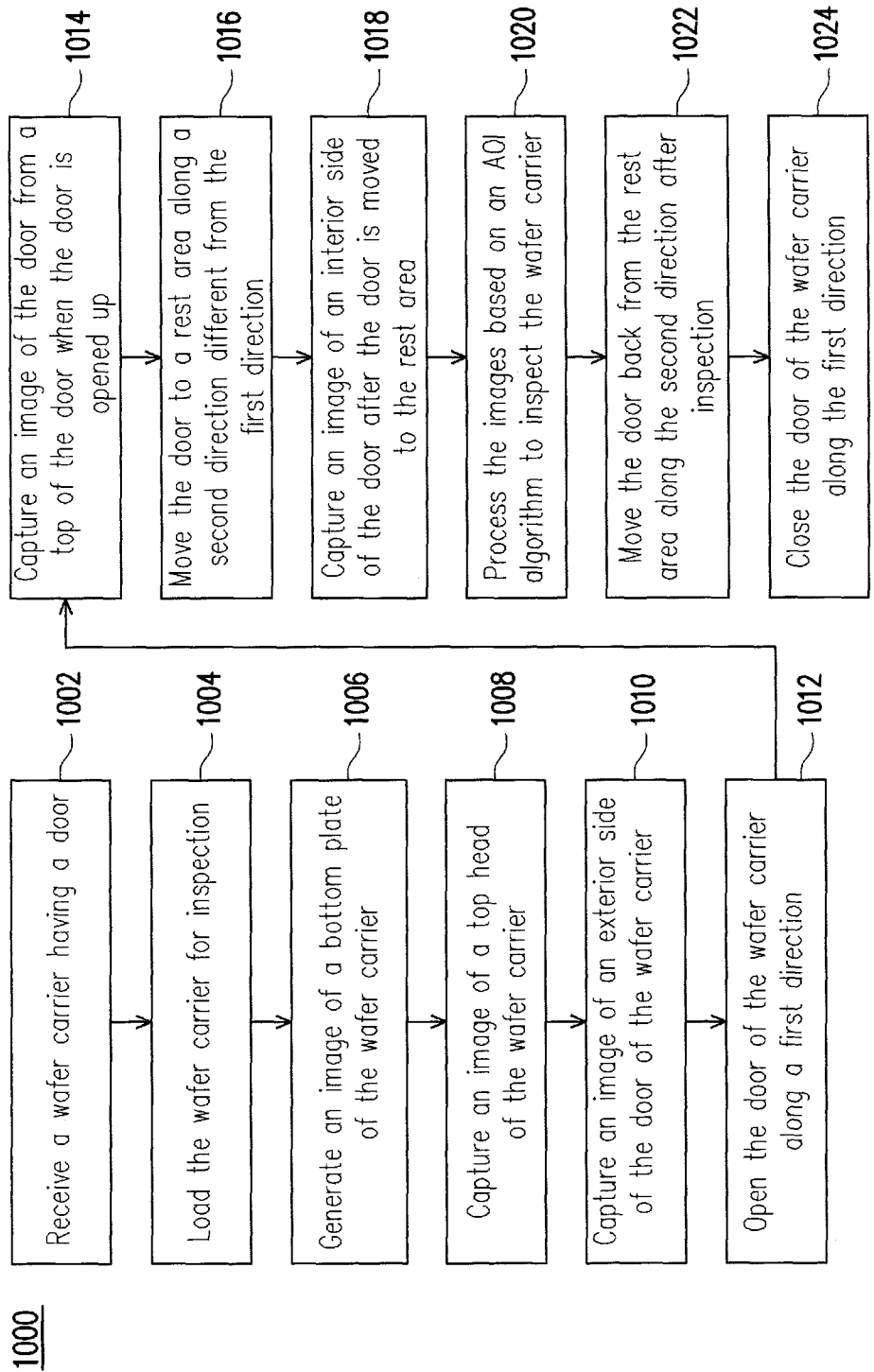
FIG. 10 is a flow chart illustrating another exemplary method for inspecting wafer carriers, in accordance with some embodiments of the present disclosure.

FIG. 10 is a flow chart illustrating another exemplary method 1000 for inspecting wafer carriers, in accordance with some embodiments of the present disclosure. As shown in FIG. 10, a wafer carrier having a door is received at 1002. The wafer carrier is loaded at 1004 for inspection. An image of a bottom plate of the wafer carrier is generated at 1006. An image of a top head of the wafer carrier is captured at 1008. An image of an exterior side of the door of the wafer carrier is captured at 1010. The door of the wafer carrier is opened at 1012 along a first direction. An image of the door is captured at 1014 from a top side of the door when the door is opened up. The door is moved at 1016 to a rest area along a second direction that is different from the first direction. An image of an interior side of the door is captured at 1018 after the door is moved to the rest area. The images are processed at 1020 based on an AOI algorithm to inspect the wafer carrier. At 1022, the door is moved back from the rest area along the second direction after inspection. The door of the wafer carrier is closed at 1024 onto the wafer carrier along the first direction.

It can be understood that the order of the steps shown in each of FIG. 9 and FIG. 10 may be changed according to different embodiments of the present disclosure.

FIG. 11 illustrates a portion of a semiconductor FAB including a wafer carrier transport tool 1140 and a wafer carrier inspection device 100 for inspecting wafer carriers, in accordance with some embodiments of the present disclosure. The portion of the FAB shown in FIG. 11 may be a schematic perspective diagram of an automatic material handling system (AMHS) 1100. As shown in FIG. 11, the AMHS 1100 includes a wafer carrier transport tool 1140, e.g. an OHT system, and a wafer carrier inspection device 100, which may be any inspection device as disclosed above in accordance with FIGS. 1-10.

In one example, the OHT system 1140 includes a network of stationary tracks or rails 1142 operable to guide the movement of a wheeled OHT vehicle 1150 supported and suspended from the rails 1142. In some embodiments, the rails 1142 are monorails that are mounted to and suspended from the ceiling 1180 and/or walls of the FAB. Rails 1142 have any suitable cross-sectional configuration as will be appreciated by those in the art so long as the OHT vehicle 1150 are appropriately supported from the rail 1142 for rolling motion.

An OHT vehicle 1150 is operable to transport a wafer carrier 1110 through the FAB for intra-bay or inter-bay movement. The OHT vehicle 1150 is configured and structured to hold a wafer carrier 1110 housing a plurality of wafers and transport the wafer carrier 1110 in a generally horizontal or lateral direction from one location to another within the FAB.

The OHT vehicle 1150 is configured and operable to pick up, raise/lower, hold, articulate, and release a wafer carrier 1110. In one embodiment, the OHT vehicle 1150 includes a motor-driven or pneumatic hoisting mechanism 1152 generally comprised of gripper assembly including one or more retractable and extendable gripper arms having a gripper on the end thereof configured for locking onto a mating hook or flange on the wafer carrier 1110. The hoisting mechanism 1152 is operable to vertically raise and lower the gripper and attached wafer carrier 1120.

As shown in FIG. 11, the OHT vehicle 1150 can hold the wafer carrier 1110, transport the wafer carrier 1110 along the rail 1142, and release the wafer carrier 1110 onto the table of the wafer carrier inspection device 100. The wafer carrier inspection device 100 can automatically inspect the exterior and interior of the wafer carrier 1110 for defects or failures, by capturing images of the wafer carrier 1110 and applying an AOI algorithm on the images, in a manner similar to what have been described in FIGS. 1-10. The wafer carrier inspection device 100 may be located on the floor 1190 of the FAB.

After the wafer carrier inspection, the wafer carrier inspection device 100 may report the inspection result, including any detected defects or failures, to an upper level system, and unload the wafer carrier 1110. Upon receiving an instruction from the upper level system, e.g. from an administrator, the wafer carrier inspection device 100 may inform the OHT vehicle 1150 to pick up the wafer carrier 1110 from the wafer carrier inspection device 100 and transport the wafer carrier 1110, either to repair the detected defects or to carry wafers if no defect was detected by the wafer carrier inspection device 100 on the wafer carrier 1110.

In an embodiment, an apparatus for inspecting wafer carriers is disclosed. The apparatus includes: a housing having an opening on a wall of the housing; a load port outside the housing; a robot arm inside the housing; and a processor. The load port is coupled to the wall and configured to load a wafer carrier for inspection. The robot arm is configured to move a first camera connected to the robot arm. The first camera is configured to capture a plurality of images of the wafer carrier. The processor is configured to process the plurality of images to inspect the wafer carrier.

In another embodiment, a method for inspecting wafer carriers is disclosed. The method includes: receiving a wafer carrier having a door; loading the wafer carrier for inspection; capturing a plurality of images of the wafer carrier by a first camera that is moved by a robot arm; opening the door of the wafer carrier along a first direction; moving the door to a rest area along a second direction that is different from the first direction; and processing the plurality of images to inspect the wafer carrier.

In yet another embodiment, a system for inspecting wafer carriers is disclosed. The system includes: an overhead transport tool configured to transport a wafer carrier; and an inspection device. The inspection device comprises: a housing having an opening on a wall of the housing, a load port outside the housing, a robot arm inside the housing, and a processor. The load port is coupled to the wall and comprises an input table configured to receive the wafer carrier transported by the overhead transport tool and load the wafer carrier for inspection. The robot arm is configured to move a first camera connected to the robot arm. The first camera is configured to capture a plurality of images of the wafer carrier. The processor is configured to process the plurality of images to inspect the wafer carrier.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for inspecting wafer carriers, comprising:
a housing having an opening on a wall of the housing;
a load port outside the housing, wherein the load port is coupled to the wall and configured to load a wafer carrier for inspection;
a robot arm inside the housing, wherein the robot arm is configured to move a first camera connected to the robot arm, wherein the first camera is configured to capture a plurality of images of the wafer carrier; and
a processor configured to process the plurality of images to inspect the wafer carrier.

2. The apparatus of claim 1, wherein:
the load port comprises an input table configured to receive the wafer carrier that has a door facing the opening on the wall, the input table being movable relative to the housing along a first direction perpendicular to the wall; and
the apparatus further comprises an opening mechanism inside the housing, wherein the opening mechanism is configured to
open the door of the wafer carrier along the first direction, and
move the door along a second direction, that is different from the first direction, to a rest area inside the housing.

3. The apparatus of claim 2, wherein:
the plurality of images includes a first image of an exterior side of the door of the wafer carrier before the door is opened and one or more images captured inside the wafer carrier after the door is opened; and
the processor is configured to determine at least one of the following:
whether there is a defect on a latch key groove of the door based on the first image,
whether there is a defect on a filter based on the one or more images,
whether there is a defect or break of a tenon based on the one or more images, and
whether a mini-contact in the wafer carrier is worn out based on the one or more images.

4. The apparatus of claim 2, further comprising a second camera inside the housing, wherein:
the second camera is coupled to the housing, located above the opening mechanism, and configured to capture a second image of the door from a top side of the door when the door is opened up along the first direction to at least 15 cm away from the wafer carrier; and
the processor is configured to determine whether a sealing strip on the door is worn out based on the second image.

5. The apparatus of claim 2, further comprising a third camera inside the housing, wherein:
the third camera is coupled to the housing, located facing the rest area, and configured to capture a third image of an interior side of the door after the door is moved to the rest area; and
the processor is configured to determine whether there is a defect on the interior side of the door based on the third image.

6. The apparatus of claim 2, further comprising a closing mechanism configured to:
move the door back from the rest area along the second direction after inspection; and
close the door of the wafer carrier along the first direction.

7. The apparatus of claim 1, further comprising a fourth camera outside the housing, wherein:
the fourth camera is coupled to the wall and configured to capture an image of a top head of the wafer carrier;
the top head is configured for an overhead transport tool to pick up and transport the wafer carrier; and
the processor is configured to determine whether there is a loose or lost screw on the top head and whether the top head is crooked based on the image.

8. The apparatus of claim 1, wherein:
the load port comprises a sensor configured to generate an image of a bottom plate of the wafer carrier; and
the processor is configured to perform at least one of the following:
determine whether inlet and outlet flows are smooth on the bottom plate based on the image;
determine whether there is a loose or lost screw on the bottom plate based on the image; and
check status of an information pad on the bottom plate based on the image.

9. The apparatus of claim 1, wherein:
the robot arm has six axes of rotation for moving the first camera; and
the first camera is a charge coupled device (CCD) camera.

10. The apparatus of claim 1, wherein the processor is configured to inspect the wafer carrier for both catastrophic failure and quality defects by applying an automated optical inspection (AOI) algorithm on the plurality of images.

11. The apparatus of claim 1, wherein the processor is further configured to perform at least one of the following:
switch operation modes of the apparatus between remote and local;
switch loading modes of the load port between auto and manual;
adjust the robot arm to determine a position and a direction of the first camera; and
adjust one or more optical parameters of the first camera.

12. A method for inspecting wafer carriers, comprising:
receiving a wafer carrier having a door;
loading the wafer carrier for inspection;
capturing a plurality of images of the wafer carrier by a first camera that is moved by a robot arm;
opening the door of the wafer carrier along a first direction;
moving the door to a rest area along a second direction that is different from the first direction; and
processing the plurality of images to inspect the wafer carrier.

13. The method of claim 12, wherein:
the plurality of images includes a first image of an exterior side of the door of the wafer carrier before the door is opened and one or more images captured inside the wafer carrier after the door is opened; and
the method further comprises determining at least one of the following:

whether there is a defect on a latch key groove of the door based on the first image, whether there is a defect on a filter based on the one or more images, whether there is a defect or break of a tenon based on the one or more images, and whether a mini-contact in the wafer carrier is worn out based on the one or more images.

14. The method of claim 12, further comprising:

capturing a second image of the door from a top side of the door when the door is opened up along the first direction to at least 15 cm away from the wafer carrier; and determining whether a sealing strip on the door is worn out based on the second image.

15. The method of claim 12, further comprising:

capturing a third image of an interior side of the door after the door is moved to the rest area; and determining whether there is a defect on the interior side of the door based on the third image.

16. The method of claim 12, further comprising:

capturing an image of a top head of the wafer carrier, wherein the top head is configured for an overhead transport tool to pick up and transport the wafer carrier; and determining whether there is a loose or lost screw on the top head and whether the top head is crooked based on the image.

17. The method of claim 12, further comprising:

generating an image of a bottom plate of the wafer carrier; and performing at least one of the following:

determining whether inlet and outlet flows are smooth on the bottom plate based on the image;

determining whether there is a loose or lost screw on the bottom plate based on a sensor; and checking status of an information pad on the bottom plate based on the sensor.

18. The method of claim 12, wherein:

the robot arm has six axes of rotation for moving the first camera; and the first camera is a CCD camera.

19. The method of claim 12, further comprising:

moving the door back from the rest area along the second direction after inspection;

closing the door of the wafer carrier along the first direction; and applying an AOI algorithm on the plurality of images to inspect the wafer carrier for both catastrophic failure and quality defects.

20. A system for inspecting wafer carriers, comprising:

an overhead transport tool configured to transport a wafer carrier; and an inspection device that comprises:

a housing having an opening on a wall of the housing, a load port outside the housing, wherein the load port is coupled to the wall and comprises an input table configured to receive the wafer carrier transported by the overhead transport tool and load the wafer carrier for inspection, a robot arm inside the housing, wherein the robot arm is configured to move a first camera connected to the robot arm, wherein the first camera is configured to capture a plurality of images of the wafer carrier, and a processor configured to process the plurality of images to inspect the wafer carrier.

\* \* \* \* \*